United States Patent [19]
Zimmer

[11] Patent Number: 6,066,895
[45] Date of Patent: May 23, 2000

[54] INTERCONNECTING STRUCTURE FOR SEMICONDUCTOR INTEGRATED CIRCUITS AND METHOD

[75] Inventor: Hans-Gunter Zimmer, Denzlingen, Germany

[73] Assignee: Micronas Intermetall GmbH, Freilburg, Germany

[21] Appl. No.: 08/539,783

[22] Filed: Oct. 5, 1995

[30] Foreign Application Priority Data

Oct. 5, 1994 [DE] Germany ................. 44 35 585

[51] Int. Cl.[7] ............ H01L 23/29; H01L 23/52; H01L 29/40
[52] U.S. Cl. ............................. 257/756; 257/532
[58] Field of Search ................... 257/532, 756, 257/303, 307, 506

[56] References Cited

U.S. PATENT DOCUMENTS 5,037,772  8/1991  McDonald .
5,420,449  5/1995  Oji ............................. 257/532

FOREIGN PATENT DOCUMENTS 5-211287  8/1993  Japan ........................ 257/532

OTHER PUBLICATIONS

Siemens Components 28, Heft 3, 1990, pp. 81–86.

*Primary Examiner*—Sheila V. Clark
*Attorney, Agent, or Firm*—Arthur L. Plevy; Buchanan Ingersoll PC

[57] ABSTRACT

An interconnecting structure for a semiconductor integrated circuit and a method for manufacturing said interconnecting structure. The interconnecting structure comprises a top layer, a bottom layer, and a dielectric isolation layer. The top layer completely covers and encloses the bottom layer. The dielectric isolation layer is disposed between the top layer and the bottom layer. At least one contact opening is formed through the top layer of the structure, thereby exposing a selected region of said bottom layer. A contact is formed on the selected region of the bottom layer.

11 Claims, 2 Drawing Sheets

INTERCONNECTING STRUCTURE FOR SEMICONDUCTOR INTEGRATED CIRCUITS AND METHOD

FIELD OF THE INVENTION

This invention relates generally to semiconductor integrated circuits, and more particularly to an interconnecting structure for semiconductor integrated circuits.

BACKGROUND OF THE INVENTION

Interconnecting structures for interconnecting layers of semiconductor material are typically employed in semiconductor integrated circuits. A prior art interconnecting structure is shown in FIG. 1 and comprises a bottom layer 12 crossed by a top layer 10, with contacts 22 formed on the bottom layer 12 at a lateral distance from the top layer 10, and a dielectric insulating layer 20 (not shown) separating the two layers 10, 12.

FIG. 2 shows a section taken along line A—A of FIG. 1. Besides the top layer 10 and the underlying bottom layer 12, the dielectric isolation layer 20 between the two layers 10, 12 can be seen, which isolates the two layers 10, 12 from each other. If the dielectric layer 20 is thin enough, a capacitance structure is obtained.

FIG. 3 shows a section taken along line B—B of FIG. 1 through the bottom layer 12. The contacts 22 are formed on the surface of the bottom layer 12 via conventional etching procedures. As can be seen, spacers 30 are formed at the sides of the bottom layer 12 during the etching procedure to form the top layer 10 (shown in FIG. 2). This is due to the fact that in the area of the edges of the bottom layer 12, the top layer 10 must be etched in double thickness. In other words, these spacers 30 are formed because in certain areas of the layers 10, 12, the entire coating, i.e., the sum of the thicknesses of layers 10 and 12, has to be etched away. As a result, if the etching is sufficiently anisotropic, the spacers 30 are left behind at the side surfaces of the bottom layer 12. Further, if a high-melting metal is then deposited by sputtering to form a silicide in order to achieve an improvement in the electrical characteristics of the arrangement, as is frequently done, the spacers 30 may cause short circuits to develop between the top layer 10 and the bottom layer 12 or oxide breakdowns may result.

Accordingly, it is the object of the present invention to substantially overcome and eliminate such disadvantages by providing an improved interconnecting structure for semiconductor integrated circuits that avoids the undesirable electrical characteristics associated with prior art interconnecting structures.

SUMMARY OF THE INVENTION

The present invention is directed to an interconnecting structure for semiconductor integrated circuits and a method for manufacturing such interconnecting structures. The interconnecting structure generally comprises a top layer, a bottom layer, and a dielectric isolation layer. The dielectric isolation layer is disposed between the top layer and the bottom layer. The top layer completely covers and encloses the dielectric isolation layer and the bottom layer. At least one opening is formed through the top layer, thereby exposing a selected region of the bottom layer. A contact is formed on the selected region of the bottom layer.

BRIEF DESCRIPTION OF THE INVENTION

The foregoing and other objects, features, and advantages of the invention will be apparent from the following description of the prior art and the preferred embodiments of the invention, as illustrated in the accompanying drawings, wherein.

DETAILED DESCRIPTION OF THE DRAWINGS

Figure 1:
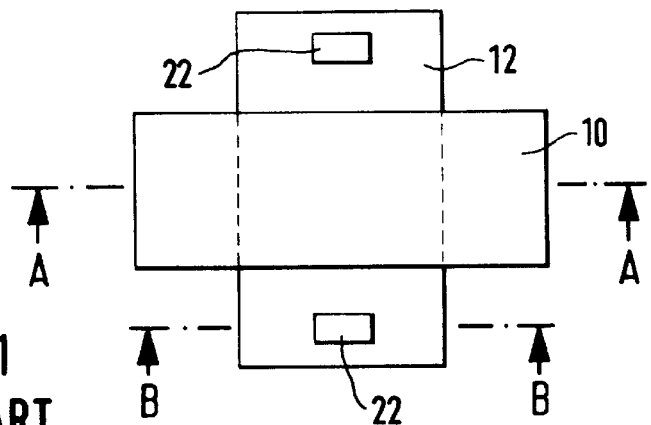
FIG. 1 is a plan view of a prior art double layer structure.
Figure 2:
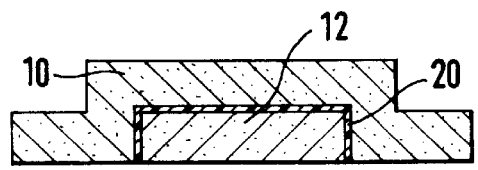
FIG. 2 is a cross-sectional view taken along line A—A of FIG. 1.
Figure 3:
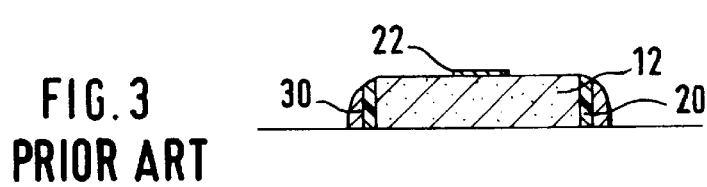
FIG. 3 is a cross-sectional view taken along line B—B of FIG. 1.
Figure 4:
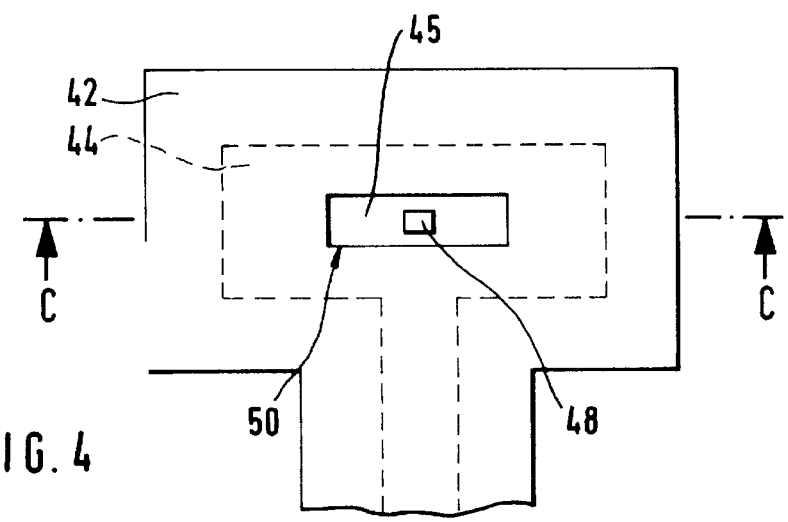
FIG. 4 is a plan view of the interconnecting structure of the present invention.

Referring to FIG. 4, a top view of an exemplary embodiment of the interconnecting structure 40 of the present invention is shown. The interconnecting structure 40 generally comprises a top layer 42 of semiconductor material completely covering a bottom layer 44 (shown by dotted line) of semiconductor material and a dielectric isolation layer 46 (shown in FIG. 5) of silicon dioxide or the like disposed between the top layer 42 and the bottom layer 44. A contact opening 50 extends through the top layer and the dielectric layer and exposes a selected region 45 of the surface of the bottom layer 44. A metallized contact 22 is formed on the selected region 45 of the surface of the bottom layer 44. Since the contact opening 50 is etched only in the top layer 42 and the dielectric isolation layer 46, no spacers resulting from the etching through both the top and bottom layers 42, 44 are left behind, as in the prior art interconnecting structure of FIGS. 1–3.

The interconnecting structure 40 shown in FIG. 4 is manufactured according to the following method.

Figure 5A:
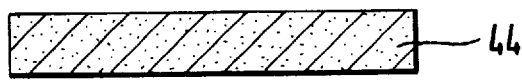
FIG. 5a is a cross-sectional view showing the formation of the bottom layer of the interconnecting structure shown in FIG. 4.

In FIG. 5a, the bottom layer 44 of semiconductor material of the interconnecting structure 40 has been deposited on a semiconductor substrate and patterned using conventional techniques, such as CVD and photolithography.

Figure 5B:
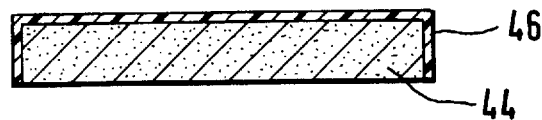
FIG. 5b is a cross-sectional view showing the formation of the dielectric isolation layer.

In FIG. 5b, the dielectric isolation layer 46 is shown deposited over the entire surface of the bottom layer 44, using conventional techniques.

Figure 5C:
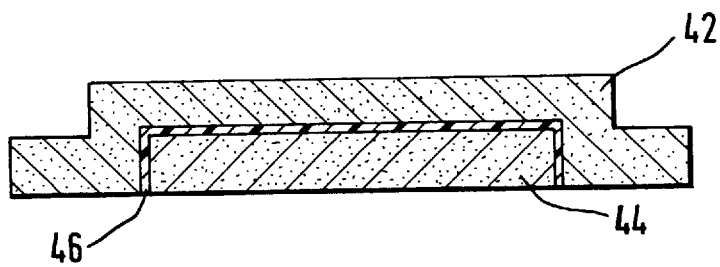
FIG. 5c is a cross-sectional view showing the formation of the top layer of the interconnecting structure shown in FIG. 4.

In FIG. 5c, the top layer 42 has been deposited over the dielectric isolation layer 46 and the bottom layer 44, such that the top layer 42 completely covers and encloses the layers 46, 44. The top layer 42 is deposited using conventional CVD techniques and the like.

Figure 5D:
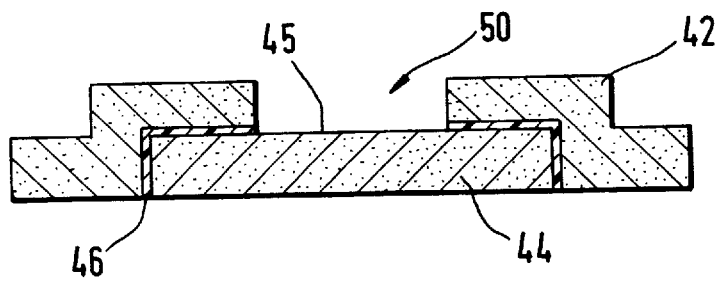
FIG. 5d is a cross-sectional view showing the formation of the contact opening of the interconnecting structure shown in FIG. 4.

In FIG. 5d, an opening 50 having a predetermined size and shape has been formed through the top layer 42 and the dielectric isolation layer 46, using conventional etching techniques, thereby exposing the selected region 45 of the surface of the bottom layer 44.

Figure 5E:
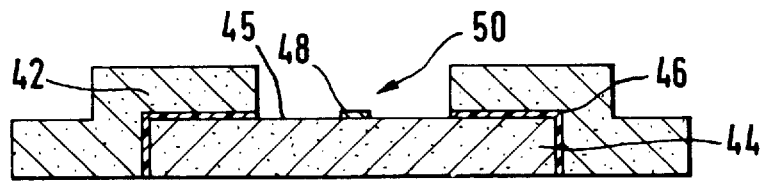
FIG. 5e is a cross-sectional view of the interconnecting structure shown in FIG. 4.

In FIG. 5e, the metallic contact 48 is shown formed on the selected region 45 of the surface of the bottom layer 44. Techniques for forming such metallic contacts 48 are well known in the art. It should be understood that the present invention is not limited to one contact and that any number of contacts can be formed on the bottom layer 44, as desired.

Accordingly, the interconnecting structure 40 of the present invention provides an improved interconnecting structure for semiconductor integrated circuits that avoids the undesirable electrical characteristics associated with prior art interconnecting structures.

While preferred forms and arrangements have been shown in illustrating the invention, it is to be understood that various changes may be made without departing from the spirit and scope of this disclosure.

What is claimed is:

1. An interconnecting structure comprising:
   a first layer of semiconductor material;
   a dielectric isolation layer disposed over said first layer;
   a second layer of semiconductor material disposed over said dielectric isolation layer; and
   at least one contact opening formed in said dielectric isolation layer and said second layer to expose a selected region of said first layer;
   wherein at least one contact is disposed on said selected surface region of said first layer such that a lateral separation exists between said at least one contact and said second layer.

2. The interconnecting structure of claim 1, wherein said first layer and said second layer are comprised of polysilicon.

3. The interconnecting structure of claim 1, wherein said dielectric isolation layer is formed from an oxide.

4. The interconnecting structure of claim 1, wherein said first layer, said dielectric isolation layer, and said second layer form a capacitance structure.

5. A semiconductor integrated circuit, comprising:
   an interconnecting structure including a first layer of semiconductor material, a dielectric isolation layer disposed over said first layer, a second layer of semiconductor material disposed over said dielectric isolation layer, at least one contact opening formed in said second layer and said dielectric isolation layer, said at least one contact opening exposing a selected region of said first layer, and at least one contact formed within said contact opening and disposed on said selected surface region of said first layer such that a lateral separation exists between said at least one contact and said second layer.

6. The semiconductor integrated circuit of claim 6, wherein said dielectric isolation layer is formed from an oxide.

7. The semiconductor integrated circuit of claim 6, wherein said first layer, said dielectric isolation layer, and said second layer form a capacitance structure.

8. The semiconductor integrated circuit of claim 6, wherein said first layer and said second layer are comprised of polysilicon.

9. The interconnecting structure of claim 1, wherein said second layer of semiconductor material disposed over said dielectric isolation layer completely covers said first layer of semiconductor material.

10. The interconnecting structure of claim 9 wherein the dielectric isolation layer disposed over said first layer completely covers said first layer of semiconductor material.

11. The semiconductor integrated circuit of claim 5 wherein said dielectric isolation layer and said second layer of semiconductor material completely cover said first layer of semiconductor material.

* * * * *